United States Patent
Xu et al.

(10) Patent No.: US 10,176,767 B2
(45) Date of Patent: Jan. 8, 2019

(54) SOURCE DRIVE INTEGRATED CIRCUITS (ICS) AND DRIVING METHODS OF LIQUID CRYSTAL PANELS

(71) Applicant: Shenzhen China Star Optoelectronics Technology Co., Ltd., Shenzhen, Guangdong (CN)

(72) Inventors: Fengcheng Xu, Guangdong (CN); Dongsheng Guo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 260 days.

(21) Appl. No.: 15/113,426

(22) PCT Filed: Jun. 21, 2016

(86) PCT No.: PCT/CN2016/086640
§ 371 (c)(1),
(2) Date: Jul. 21, 2016

(87) PCT Pub. No.: WO2017/206209
PCT Pub. Date: Dec. 7, 2017

(65) Prior Publication Data
US 2018/0174530 A1    Jun. 21, 2018

(30) Foreign Application Priority Data
May 30, 2016    (CN) .......................... 2016 1 0373125

(51) Int. Cl.
*G09G 3/36* (2006.01)
*H03M 1/66* (2006.01)

(52) U.S. Cl.
CPC .............. *G09G 3/36* (2013.01); *H03M 1/66* (2013.01); *G09G 2310/0264* (2013.01)

(58) Field of Classification Search
CPC .... G09G 3/36; G09G 2310/0264; H03M 1/66
See application file for complete search history.

(56) References Cited

U.S. PATENT DOCUMENTS

2005/0001812 A1*    1/2005    Amundson ............. G02F 1/167
345/107

* cited by examiner

*Primary Examiner* — Charles Hicks
(74) *Attorney, Agent, or Firm* — Andrew C. Cheng

(57) ABSTRACT

The present disclosure relates to a source drive IC of liquid crystal panels. The source drive IC includes a digital signals module, a Gamma reference voltage module, a comparator, a power voltage module, a selector, a digital-to-analog converter (DAC) and a buffer amplifier. In addition, a driving method of liquid crystal panels may reduce the power consumption of the buffer amplifier to decrease the temperature of the source drive IC so as to enhance the reliability of the liquid crystal panel.

12 Claims, 6 Drawing Sheets

SOURCE DRIVE INTEGRATED CIRCUITS (ICS) AND DRIVING METHODS OF LIQUID CRYSTAL PANELS

CROSS REFERENCE

This application claims the priority of Chinese Patent Application No. 201610373125.8, entitled "Source drive ICs and driving methods of liquid crystal panels", filed on May 30, 2016, the disclosure of which is incorporated herein by reference in its entirety.

FIELD OF THE INVENTION

The present invention relates to a liquid crystal technology field, and more particularly to a source drive IC and a driving method of liquid crystal panels.

BACKGROUND OF THE INVENTION

One of driving circuits of thin film transistor (TFT) liquid crystal panels is a source drive IC. The source drive IC is configured to turn on the TFT, to supply signals to the data line, and to charge the pixel electrode to a corresponding grayscale voltage. Usually, a terminal of the source drive IC is constituted by a buffer amplifier, such that a low loading input end receives simulation signals, and the amplified output capability drives the high loading of the pixel array. In order to reduce the power consumption of the buffer amplifier, the power voltage of the buffer amplifier usually is loaded by half-voltage driving method.

With the increasement of the dimension and resolution of liquid crystal panels, the pixel loading driven by the source drive IC is also increased, which comes along with the larger power consumption of the buffer amplifier and the higher temperature of the source drive IC. The conventional half-voltage driving method may not able to resolve the increased power consumption issue, which may greatly reduce the reliability of the liquid crystal panel.

SUMMARY OF THE INVENTION

The present disclosure relates to a source drive IC and a driving method of liquid crystal panels for reducing the power consumption of the buffer amplifier.

In one aspect, a source drive IC of liquid crystal panels includes: a digital signals module, a Gamma reference voltage module, a comparator, a power voltage module, a selector, a digital-to-analog converter (DAC) and a buffer amplifier; the digital signals module is configured for providing digital input signals, and for transmitting the digital input signals to the comparator and the DAC, and the digital input signals includes a digital input voltage (Ud); the Gamma reference voltage module is configured for providing one set of Gamma reference voltage signals, and for transmitting the one set of Gamma reference voltage signals to the comparator, the one set of Gamma reference voltage signals include one set of Gamma reference voltage signals {G1, G2, ... Gi, ..., Gn}, wherein n is a positive integer greater than 1, the {G1, G2, ... Gi, ..., Gn} is arranged to be a descending sequence, and $G1 \leq Ud \leq Gn$; the comparator is configured for receiving the digital input signals from the digital signals module and for receiving one set of Gamma reference voltage signals from the Gamma reference voltage module, comparing the digital input signals and the Gamma reference voltage signals to obtain a specific value range of the Ud within the {G1, G2, ... Gi, ..., Gn}, generating the control signals indicative of the specific value range, and transmit the control signals to the selector; the power voltage module is configured for providing one set of the Gamma reference voltage signals, first power voltage signals, and second power voltage signals to the selector, the first power voltage signals includes a first power voltage (Ua), the second power voltage signals includes a second power voltage (Ub), wherein $0 \leq Ua < Ud < Ub$, and when Ua=0, Ua<Gn and Ub<G1, and when Ua>0, Ua>Gn and Ub>G1; the selector is configured for receiving the control signals from the comparator, one set of the Gamma reference voltage signals from the power voltage module, the first power voltage signals and the second power voltage signals, two signals are selected from the one set of Gamma reference voltage signals, the first power voltage signals, and the second power voltage signals in accordance with the control signals to respectively be the positive power voltage signals and the negative power voltage signals, one of the positive power voltage signals and the negative power voltage signals obtains one of the first power voltage signals and the second power voltage signals, the positive power voltage signals include the positive power voltage (Vb), and the negative power voltage signals include the negative power voltage (Va) such that Va<Ud<Vb and Vb−Va<Ub−Ua, the positive power voltage signals and the negative power voltage signals are transmitted to the buffer amplifier; the DAC is configured for receiving the digital input signals from the digital signals module, applying a digital to analog conversion to the digital input signals to obtain simulation input signals, and transmitting the simulation input signals to the buffer amplifier; and the buffer amplifier is configured for receiving the positive power voltage signals and the negative power voltage signals from the selector, and the simulation input signals from the DAC, and to conduct corresponding signals processing.

Wherein the Vb and the Va further satisfy the equation: $Vb \leq Ub$ and $Va \leq Ua$, and wherein one of the Vb and the Va obtains one of the Ub and Ua.

Wherein the comparator determines the specific value range to be Ud=Gi, the comparator generates the control signals indicative of the specific value range, and transmits the control signals to the selector; the selector selects (i−1)-th Gamma reference voltage signals and the (i+1)-th Gamma reference voltage signals from the one set of Gamma reference voltage signals provided by the power voltage module in accordance with the control signals from the comparator to respectively be the positive power voltage signals and the negative power voltage signals of the buffer amplifier, wherein Vb=Gi−1 and Va=Gi+1, and i=2, 3, 4, ..., n−1.

Wherein: the specific value range determined by the comparator is Ud∈(Gi,Gi+1), the comparator generates the control signals indicating the specific value range to be Ud∈(Gi,Gi+1) and transmitting the control signals to the selector;

the selector selects i-th Gamma reference voltage signals and the (i+1)-th Gamma reference voltage signals from the one set of Gamma reference voltage signals in accordance with the control signals from the comparator to respectively be the positive power voltage signals and the negative power voltage signals of the buffer amplifier, wherein Vb=Gi, Va=Gi+1, and i=1, 2, 3, ..., n−1.

Wherein: the specific value range determined by the comparator is Ud=G1; the selector selects the second power voltage signals according to the control signals to be positive power voltage signal of the buffer amplifier, and the selector selects second Gamma reference voltage signals from one set of the Gamma reference voltage signals to be the negative power voltage signals of the buffer amplifier, wherein Vb=Ub, and Va=G2.

Wherein: the specific value range determined by the comparator is Ud=Gn; the selector selects the (n−1)-th Gamma reference voltage signals from one set of the Gamma reference voltage signals according to the control signals to be the positive power voltage signals of the buffer amplifier, and selects the first power voltage signals according to the control signals to be the negative power voltage signals of the buffer amplifier, wherein Vb=Gn−1, and Va=Ua.

Wherein the one set of the Gamma reference voltage signals provided by the Gamma reference voltage module includes 14 Gamma reference voltage signals.

In another aspect, a driving method of liquid crystal panels includes: a digital signals module transmits the digital input signals to a comparator and a DAC, and the digital input signals includes digital input voltage (Ud); a Gamma reference voltage module transmits one set of the Gamma reference voltage signals to the comparator, the one set of the Gamma reference voltage signals represent one set of Gamma reference voltages {G1, G2, . . . Gi, . . . , Gn}, wherein n is a positive integer greater than 1, the {G1, G2, . . . Gi, . . . , Gn} is arranged to be a descending sequence, and G1≤Ud≤Gn; the comparator receives the digital input signals and one set of the Gamma reference voltage signals, the digital input signals and the Gamma reference voltage signals are compared to determine a specific value range of the Ud within the {G1, G2, . . . Gi, . . . , Gn}, and the comparator generates the control signals indicative of the specific value range, and transmits the control signals to the selector; the power voltage module transmits one set of the Gamma reference voltage signals, first power voltage signals, and second power voltage signals to the selector, first power voltage signals includes a first power voltage (Ua), second power voltage signals includes a second power voltage (Ub), wherein 0≤Ua<Ud<Ub, and when Ua=0, Ua<Gn and Ub<G1; When Ua>0, Ua>Gn and Ub>G1; the selector receives the control signals from the comparator, one set of the Gamma reference voltage signals, the first power voltage signals and the second power voltage signals, two signals are selected from the one set of Gamma reference voltage signals, the first power voltage signals, and the second power voltage signals in accordance with the control signals to respectively be the positive power voltage signals and the negative power voltage signals, one of the positive power voltage signals and the negative power voltage signals obtains one of the first power voltage signals and the second power voltage signals; the positive power voltage signals include the positive power voltage (Vb), and the negative power voltage signals include the negative power voltage (Va) such that Va<Ud<Vb and Vb−Va<Ub−Ua, the positive power voltage signals and the negative power voltage signals are transmitted to the buffer amplifier; the DAC receives the digital input signals, applies the digital to analog conversion to the digital input signals to obtain simulation input signals, and transmits the simulation input signals to the buffer amplifier; the buffer amplifier receives the positive power voltage signals, the negative power voltage signals, and the simulation input signals to conduct corresponding signals processing.

Wherein the Vb and the Va further satisfy the equation: Vb≤Ub and Va≤Ua, and wherein one of the Vb and the Va obtains one of the Ub and the Ua.

Wherein the comparator determines the specific value range to be Ud=Gi, the comparator generates the control signals indicative of the specific value range, and transmits the control signals to the selector; the selector selects (i−1)-th Gamma reference voltage signals and the (i+1)-th Gamma reference voltage signals from the one set of Gamma reference voltage signals provided by the power voltage module in accordance with the control signals from the comparator to respectively be the positive power voltage signals and the negative power voltage signals of the buffer amplifier, wherein Vb=Gi−1 and Va=Gi+1, and i=2, 3, 4, . . . , n−1.

Wherein: the specific value range determined by the comparator is Ud∈(Gi,Gi+1), the selector selects i-th Gamma reference voltage signals and the (i+1)-th Gamma reference voltage signals from the one set of Gamma reference voltage signals in accordance with the control signals to respectively be the positive power voltage signals and the negative power voltage signals of the buffer amplifier, wherein Vb=Gi, Va=Gi+1, and i=1, 2, 3, . . . , n−1.

Wherein: the specific value range determined by the comparator is Ud=G1; the selector selects the second power voltage signals according to the control signals to be positive power voltage signal of the buffer amplifier, and the selector selects second Gamma reference voltage signals from one set of the Gamma reference voltage signals to be the negative power voltage signals of the buffer amplifier, wherein Vb=Ub, and Va=G2.

Wherein: the specific value range determined by the comparator is Ud=Gn; the selector selects the (n−1)-th Gamma reference voltage signals from one set of the Gamma reference voltage signals according to the control signals to be the positive power voltage signals of the buffer amplifier, and selects the first power voltage signals according to the control signals to be the negative power voltage signals of the buffer amplifier, wherein Vb=Gn−1, and Va=Ua.

Wherein the one set of the Gamma reference voltage signals includes 14 Gamma reference voltage signals.

In view of the above, the comparator compares the digital input signals and one set of Gamma reference voltage signals to ensure the digital input signals are within the specific value range of one set of the Gamma reference voltage signals, and then generates the control signals indicative of the specific value range. The selector selects two signals from one set of the Gamma reference voltage signals, the first power voltage signals and the second power voltage signals to respectively be the positive power voltage signals and the negative power voltage signals. One of the positive power voltage signals and the negative power voltage signals obtains one of the second power voltage signals and the first power voltage signals such that the voltage difference between the positive and negative power voltage of the buffer amplifier is smaller than that of the buffer amplifier driven by the half-voltage driving method, and thus the power consumption of the buffer amplifier may be reduced. In such configuration, the temperature of the buffer amplifier and the source drive IC may be controlled so as to enhance the reliability of the liquid crystal panel.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Currently, the terminal of the source drive IC is constituted by the buffer amplifier. The source drive IC drives the pixel loading, and may consume the power and generate the heat. Most of the power consumption of the whole source drive IC concentrates on the buffer amplifier, and thus the circuit design of the buffer amplifier has to be considered.

Usually, the buffer amplifier includes a signal input end, a signal output end, a positive power voltage end, and a negative power voltage end. Conventionally, the positive power voltage is AVDD, and the negative power voltage is GND. The power consumption of the buffer amplifier is determined in accordance with a voltage difference between the positive and negative power voltage. In the above-mentioned loading method, as the voltage difference between the positive and negative power voltage is huge, that is, the result of AVDD minus GND is huge, the power consumption of the buffer amplifier is high.

Figure 1:
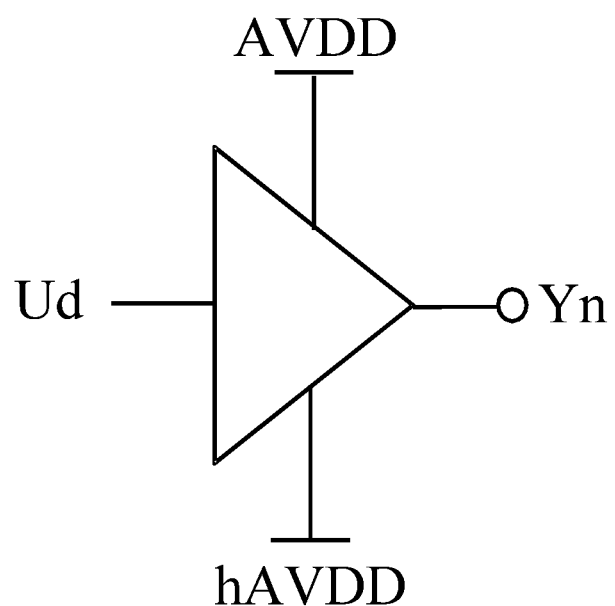
FIG. 1 is a schematic view of one conventional buffer amplifier loaded with a power voltage by a half-driven driving method.

In order to reduce the power consumption, the half-voltage driving method is adopted to load the power voltage of the buffer amplifier. Specifically, as shown in FIG. 1, the input end voltage of the buffer amplifier is Ud, the output end voltage is Yn, the positive power voltage is AVDD, the negative power voltage is hAVDD, and the negative power voltage (hAVDD) is around half of the positive power voltage (AVDD). By configuring a voltage reference location (hAVDD) between the AVDD and the GND, the result of AVDD−hAVDD is smaller than the result of AVDD−GND. As such, the voltage difference is decreased so as to reduce the power consumption of the buffer amplifier. However, with the increasement of the dimension and resolution of liquid crystal panels, the pixel loading driven by the source drive IC is also increased, which comes along with the larger power consumption of the buffer amplifier and the higher temperature of the source drive IC. The conventional half-voltage driving method may not able to resolve the increased power consumption issue, which may greatly reduce the reliability of the liquid crystal panel.

Figure 2:
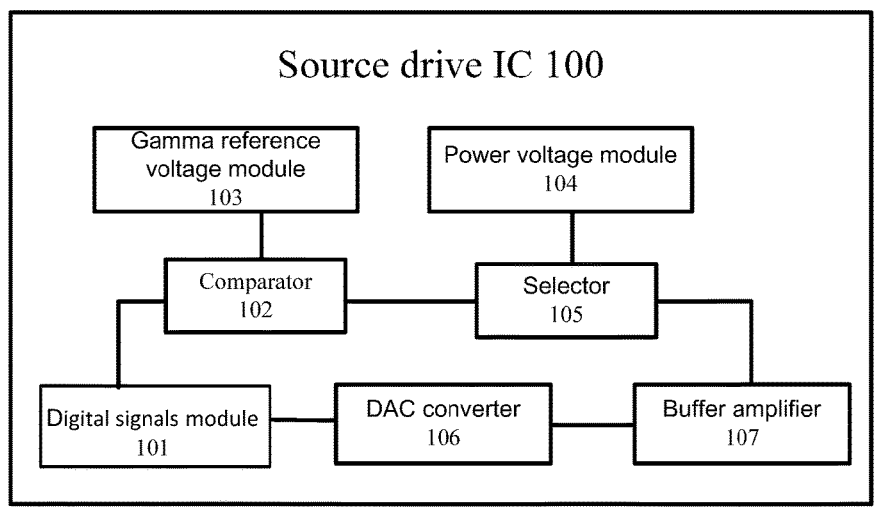
FIG. 2 is a schematic view of the source drive IC in accordance with one embodiment.

As shown in FIG. 2, the source drive IC 100 includes a digital signals module 101, a comparator 102, a Gamma reference voltage module 103, a power voltage module 104, a selector 105, a digital-to-analog converter (DAC) 106 and a buffer amplifier 107.

The digital signals module 101, the comparator 102, and the DAC converter 106 are electrically connected, and the digital signals module 101 is configured for providing the digital input signals, and for transmitting the digital input signals to the comparator 102 and the DAC converter 106. The digital input signals include the digital signals carrying the color information, and the digital input signals include the digital input voltage (Ud).

The Gamma reference voltage module 103 electrically connects to the comparator 102 for providing one set of Gamma reference voltage signals, and for transmitting one set of Gamma reference voltage signals to the comparator 102. The one set of the Gamma reference voltage signals represent on set of Gamma reference voltage signals {G1, G2, . . . Gi, . . . , Gn}, wherein n is a positive integer greater than 1. The i-th Gamma reference voltage signals include i-th Gamma reference voltage (Gi). The {G1, G2, . . . Gi, . . . , Gn} is arranged from G1 to Gn in sequence. The one set of the Gamma reference voltage signals is one reference voltage for displaying grayscale of the liquid crystal panel. In one embodiment, the one set of the Gamma reference voltage signals includes 14 Gamma reference voltage signals. Correspondingly, the one set of Gamma reference voltage includes 14 Gamma reference voltages. For example, G1=15V, G2=14V, G3=13V, G7=7V, and G14=1V. The specific values of each of the Gamma reference voltages (Gi) may be configured in accordance with real scenario, and thus are not limited to the above values. In other embodiments, one set of Gamma reference voltage signals may include other number of the Gamma reference voltage signals. Correspondingly, the one set Gamma reference voltage may include other number of the Gamma reference voltages. For instance, the one set of Gamma reference voltage signals may include 16 or 20 Gamma reference voltage signals, and one set of Gamma reference voltages may include 16 or 20 Gamma reference voltage.

In the source drive IC, the buffer amplifier amplifies the inputted digital input voltage (Ud) at the ratio of 1:1. That is, the output end voltage (Yn) and one set of Gamma reference voltage {G1, G2, . . . Gi, . . . , Gn} satisfy the equation: G1≤Yn≤Gn. Specifically, Yn may be between any two adjacent Gamma reference voltages of {G1, G2, . . .

Gi, . . . , Gn}. Thus, the digital input voltage (Ud) and one set of Gamma reference voltage {G1, G2, . . . Gi, . . . , Gn} satisfy the equation: G1≤Ud≤Gn. That is, Ud may be between any two adjacent Gamma reference voltages of {G1, G2, . . . Gi, . . . , Gn}, or may be any one of the Gamma reference voltage within the {G1, G2, . . . Gi, . . . , Gn}.

The comparator 102 connects to the digital signals module 101, the Gamma reference voltage module 103, and the selector 105. The comparator 102 is configured for receiving the digital input signals from the digital signals module 101, and to receive one set of Gamma reference voltage signals from the Gamma reference voltage module 103. After receiving the digital input signals and one set of the Gamma reference voltage signals, the digital input signals and the Gamma reference voltage signals are compared to determine a specific value range of the Ud within the {G1, G2, . . . Gi, . . . , Gn}, to generate the control signals indicative of the specific value range, and to transmit the control signals to the selector 105. Specifically, the comparator 102 performs logical comparison calculation in view of the digital input signals and one set of the Gamma reference voltage signals to ensure the specific value range. The specific value range relates to a specific value location of the Ud within the {G1, G2, . . . Gi, . . . , Gn}. That is, the digital input voltage (Ud) is between two adjacent Gamma reference voltages within the {G1, G2, . . . Gi, . . . , Gn}. Alternatively, the digital input voltage (Ud) may equal to one Gamma reference voltage within the {G1, G2, . . . Gi, . . . , Gn}. After the specific value range is determined by the comparator 102, the control signals indicative of the specific value range are generated, and the control signals are transmitted to the selector 105 to control the further process of the selector 105.

The power voltage module 104 electrically connects to the selector 105. The power voltage module 104 is configured to provide one set of the Gamma reference voltage signals, first power voltage signals, and second power voltage signals to the selector 105. The power voltage module 104 may obtain one set of the Gamma reference voltage signals via the source drive IC 100 or other circuit units. The power voltage module 104 obtains the one set of the Gamma reference voltage signals and provides the one set of the Gamma reference voltage signals, which are the same with the Gamma reference voltage signals provided by the Gamma reference voltage module 103. Preferably, in other embodiment, the power voltage module 104 electrically connects to the Gamma reference voltage module 103, and the power voltage module 104 obtains one set of the Gamma reference voltage signals from the Gamma reference voltage module 103.

The first power voltage signals and the second power voltage signals are the power voltages loaded when the half-voltage driving method is adopted by the buffer amplifier 107, wherein the first power voltage signals is the negative power voltage signals when the half-voltage driving method is adopted by the buffer amplifier 107, and the first power voltage signals include the first power voltage (Ua). The second power voltage signals is the positive power voltage signals when the half-voltage driving method is adopted by the buffer amplifier 107, and the second power voltage signals include the second power voltage (Ub), wherein Ud, {G1, G2, . . . Gi, . . . , Gn}, Ua and Ub satisfy the equation: 0≤Ua<Ud<Ub, and when Ua=0, Ua<Gn and Ub<G1; When Ua>0, Ua>Gn and Ub>G1.

Specifically, as the liquid crystals are driven by the polarity inversion method, that is, the directions of the electrical field applying toward the liquid crystals are opposite. Thus, the output voltages of the buffer amplifier 107 have to be configured with the positive and the negative polarity so as to drive the liquid crystals. In addition, the output end voltage (Yn) of the buffer amplifier 107 is between the positive power voltage and the negative power voltage, that is, the digital input voltage (Ud) is between the positive power voltage and the negative power voltage. Thus, when the half-voltage driving method is adopted and when the output voltage of positive polarity has to be provided, the positive power voltage (AVDD) is loaded on the positive power voltage end of the buffer amplifier 107, and the negative power voltage (hAVDD) is loaded on the negative power voltage end, wherein 0<hAVDD<Ud<AVDD. When the output voltage of negative polarity has to be provided, positive power voltage (AVDD) is loaded on the positive power voltage end of the buffer amplifier 107, and the negative power voltage (GND) is loaded on the negative power voltage end, wherein 0=GND<Ud<hAVDD. Thus, 0≤Ua<Ud<Ub. The positive power voltage (AVDD) and the negative power voltage (hAVDD) are regular power voltage values of the buffer amplifier 107, and may be configured in accordance with real demands. In the embodiment, AVDD=16V, and hAVDD=8V. However, the present disclosure is not limited to the above values.

Figure 3:
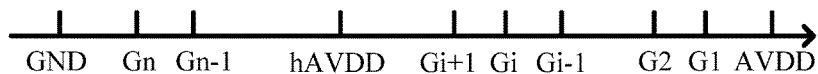
FIG. 3 is a schematic view showing the locations of the voltages on the x-axis of each of the voltage signals provided by the power voltage module of FIG. 2.

FIG. 3 is a schematic view showing the locations of the positive power voltage (AVDD), the negative power voltage (hAVDD), the negative power voltage (GND), and one set of the Gamma reference voltage {G1, G2, . . . Gi, . . . , Gn} of the buffer amplifier 107 on the x-axis. The relationship may be concluded by referring to FIG. 3. When Ua=GND=0, Ua=GND<Gn and Ub=hAVDD<G1. At this moment, the buffer amplifier 107 provides the output voltage of negative polarity. When Ua=hAVDD>0, Ua=hAVDD>Gn and Ub=AVDD>G1, wherein the buffer amplifier 107 provides the output voltage of positive polarity. In view of the above, 0≤Ua<Ud<Ub. In addition, when Ua=0, Ua<Gn and Ub<G1. When Ua>0, Ua>Gn and Ub>G1.

The selector 105 electrically connects to the comparator 102, the power voltage module 104, and the buffer amplifier 107. The selector 105 is configured for receiving the control signals from the comparator 102, one set of the Gamma reference voltage signals from the power voltage module 104, the first power voltage signals, and the second power voltage signals from the power voltage module 104. Two signals are selected from the one set of Gamma reference voltage signals, the first power voltage signals, and the second power voltage signals in accordance with the control signals to respectively be the positive power voltage signals and the negative power voltage signals. One of the positive power voltage signals and the negative power voltage signals may respectively obtain one of the first power voltage signals and the second power voltage signals. The positive power voltage signals include the positive power voltage (Vb), and the negative power voltage signals include the negative power voltage (Va) such that Va<Ud<Vb and Vb−Va<Ub−Ua. The positive power voltage signals and the negative power voltage signals are transmitted to the buffer amplifier 107.

Figure 4:
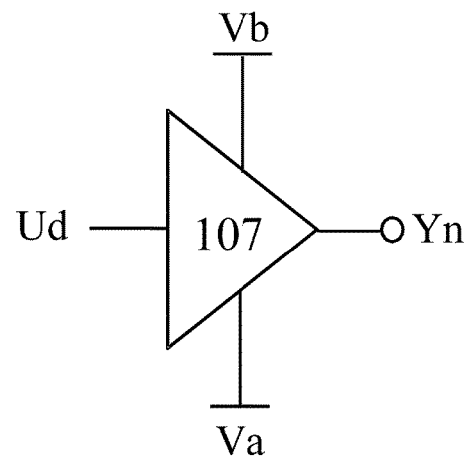
FIG. 4 is a schematic view of the buffer amplifier of FIG. 2.

Specifically, the control signals indicate the specific value range of the digital input voltage (Ud). The selector 105 selects two signals from one set of the Gamma reference voltage signals in accordance with the specific value range indicated by the control signals to respectively be the positive power voltage signals and the negative power voltage signals of the buffer amplifier 107. Alternatively, the selector 105 selects one signal from the one set of the Gamma reference voltage signals to be the positive power voltage signals or the negative power voltage signals, and selects one signal from the first power voltage signals and the second power voltage signals to be the negative power voltage signals or the positive power voltage signals. However, the first power voltage signals and the second power voltage signals cannot be selected simultaneously to be the negative power voltage signals and the positive power voltage signals. As shown in FIG. 4, as the positive power voltage signals and the negative power voltage signals selected by the selector 105 are from the power voltage module 104, in view of the above, the digital input voltage (Ud), the positive power voltage (Vb) of the positive power voltage signals, and the negative power voltage (Va) of the negative power voltage signals satisfy the equation: Va<Ud<Vb. To sure the voltage difference of the power voltage of the buffer amplifier 107 is smaller than the voltage difference of the half-voltage driving method, the equation "Vb−Va<Ub−Ua" has to be satisfied.

In one embodiment, when the equation "Vb−Va<Ub−Ua" is satisfied, Vb<Ub and Va>Ua. At this moment, Vb and Va are respectively two Gamma reference voltage signals within the {G1, G2, ... Gi, ..., Gn}. Alternatively, Vb=Ub, and Va>Ua. At this moment, Vb is the second power voltage (Ub), Va is one of the Gamma reference voltage within the {G1, G2, ... Gi, ..., Gn}. Alternatively, Vb<Ub and Va=Ua. At this moment, Vb is one of the Gamma reference voltage signals within the {G1, G2, ... Gi, ..., Gn}, and Va is the first power voltage (Ua).

Figure 5:
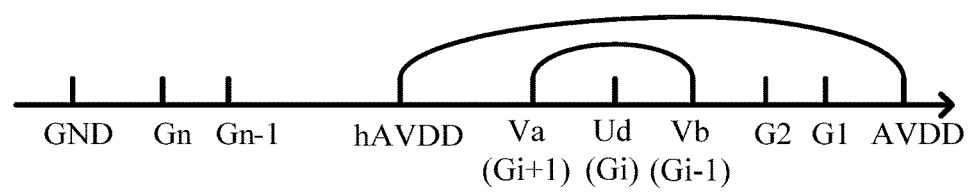
FIG. 5 is a schematic view showing the locations of the positive power voltage of the positive power voltage signals and of the negative power voltage of the negative power voltage signals selected by a selector of FIG. 2.

As shown in FIG. 5, in one embodiment, the comparator 102 determines the specific value range, that is, Ud=Gi. Afterwards, the comparator 102 generates the control signals indicative of Ud=Gi, and sends the control signals to the selector 105. At this moment, the selector 105 selects (i−1)-th Gamma reference voltage signals and the (i+1)-th Gamma reference voltage signals from the one set of Gamma reference voltage signals {G1, G2, ... Gi, ..., Gn} in accordance with the control signals from the comparator 102, and the selected signals are configured to be the positive power voltage signals and the negative power voltage signals of the buffer amplifier 107, wherein Vb=Gi−1 and Va=Gi+1, and i=2, 3, 4, ..., n−1. That is, Vb and Va are at two adjacent sides of Ud. In one embodiment, the voltage difference (AVDD−hAVDD) between the positive and negative power voltage loaded on the buffer amplifier 107 driven by the half-voltage driving method is adopted as one comparison target, and Gb=AVDD=16V, and Ga=hAVDD=8V, and n=14. When i=5, Ud=G5=11V, Vb=G4=12V, and Va=G6=10V. Then Vb−Va=G4−G6=12V−10V=2V. When Gb−Ga=AVDD−hAVDD≈16V−8V≈8V. In view of the above calculation, Vb−Va<AVDD−hAVDD. In another example, when i=2, Ud=G2=14V, Vb=G1=15V, and Va=G3=13V. Then Vb−Va=G1−G3=15V−13V=2V, and Gb−Ga=AVDD−hAVDD≈16V−8V≈8V. Similarly, in view of the calculation, Vb−Va<AVDD−hAVDD. In another example, when i=13, Ud=G13=2V, Vb=G12=3V, and Va=G14=1V. Then Vb−Va=G12−G14=3V−1V=2V. However, Gb−Ga=AVDD−hAVDD≈16V−8V≈8V. Similarly, in view of the calculation, Vb−Va<AVDD−hAVDD$_o$ Thus, the voltage difference between the power voltages on the buffer amplifier 107 is Vb−Va<AVDD−hAVDD. Similarly, the voltage difference (hAVDD−GND) between the positive and negative power voltage loaded on the buffer amplifier 107 driven by the half-voltage driving method is adopted as one comparison target to obtain Vb−Va<hAVDD−GND. To simplify, the examples are omitted hereinafter. However, with respect to the source drive IC 100, the selector 105 selects two Gamma reference voltage signals as the positive and negative power voltage signals of the buffer amplifier 107. In addition, the positive and negative power voltage signals are arranged at two adjacent sides of the digital input voltage (Ud) to decrease the voltage difference loaded on the positive and negative power voltage of the buffer amplifier 107, so as to reduce the power consumption of the buffer amplifier 107.

Figure 6:
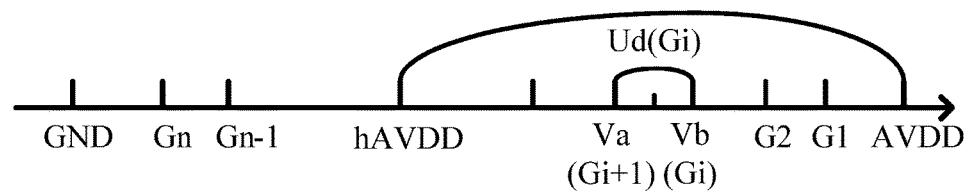
FIG. 6 is another schematic view showing the locations of the positive power voltage of the positive power voltage signals and of the negative power voltage of the negative power voltage signals selected by the selector of FIG. 2.

FIG. 6 relates to the second embodiment. The difference between the second embodiment and the first embodiment will be described hereinafter. The comparator 102 determines the specific value range to be Ud∈(Gi,Gi+1). At this moment, the selector 105 selects i-th Gamma reference voltage signals and the (i+1)-th Gamma reference voltage signals from the one set of Gamma reference voltage signals {G1, G2, ... Gi, ..., Gn} in accordance with the control signals from the comparator 102, and the selected signals are configured to be the positive power voltage signals and the negative power voltage signals of the buffer amplifier 107, wherein Vb=Gi, Va=Gi+1, and i=1, 2, 3, ..., n−1. That is, the Vb and Va are at two adjacent sides of the Ud on the axis. Similarly, the selector 105 selects two Gamma reference voltage signals to be the positive and negative power voltage signals of the buffer amplifier 107. In addition, the positive and negative power voltage signals are arranged at two adjacent sides of the digital input voltage (Ud) to decrease the voltage difference loaded on the positive and negative power voltage of the buffer amplifier 107, so as to reduce the power consumption of the buffer amplifier 107. For simplicity, new examples are omitted hereinafter.

Figure 7:
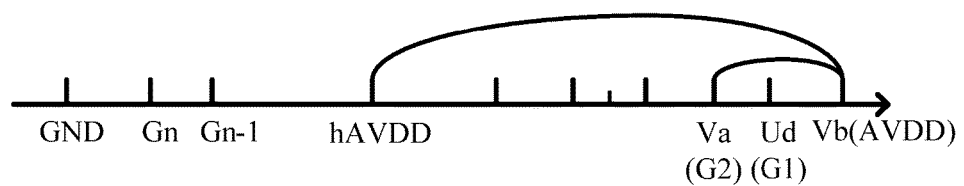
FIG. 7 is another schematic view showing the locations of the positive power voltage of the positive power voltage signals and of the negative power voltage of the negative power voltage signals selected by the selector of FIG. 2.

FIG. 7 relates to the third embodiment. The difference between the third embodiment and the first embodiment will be described hereinafter. The comparator 102 determines the specific value range to be Ud=G1, and the selector 105 selects the second power voltage signals from the power voltage module 104 to be the positive power voltage signals in accordance with the control signals from the comparator 102. In addition, the selector 105 selects a second Gamma reference voltage signals from one set of the Gamma reference voltage signals provided by the power voltage module 104 to be the negative power voltage signals of the buffer amplifier 107, wherein Vb=Ub=AVDD, Va=G2. That is, the Vb and Va are at two adjacent sides of the Ud on the axis. Similarly, the selector 105 selects two Gamma reference voltage signals as the positive and negative power voltage signals of the buffer amplifier 107. In addition, the positive and negative power voltage signals are arranged at two adjacent sides of the digital input voltage (Ud) to decrease the voltage difference loaded on the positive and negative power voltage of the buffer amplifier 107, so as to reduce the power consumption of the buffer amplifier 107. For simplicity, new examples are omitted hereinafter.

Figure 8:
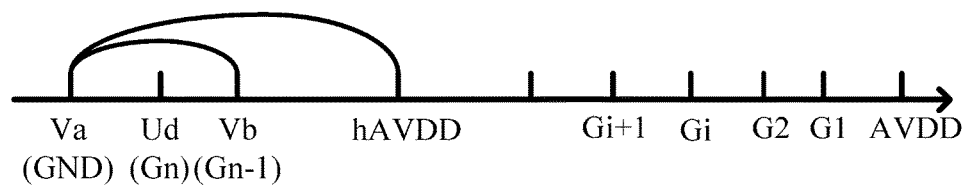
FIG. 8 is another schematic view showing the locations of the positive power voltage of the positive power voltage signals and of the negative power voltage of the negative power voltage signals selected by the selector of FIG. 2.

FIG. 8 relates to the fourth embodiment. The difference between the fourth embodiment and the first embodiment will be described hereinafter.

The comparator 102 determines the specific value range to be Ud=Gn, and the selector 105 selects the first power voltage signals from the power voltage module 104 to be the negative power voltage signals in accordance with the control signals from the comparator 102. In addition, the selector 105 selects a (n−1)-th Gamma reference voltage signals from one set of the Gamma reference voltage signals provided by the power voltage module 104 to be the positive power voltage signals of the buffer amplifier 107, wherein Vb=Gn−1, Va=Ua=GND. That is, the Vb and Va are at two adjacent sides of the Ud on the axis. Similarly, the selector 105 selects two Gamma reference voltage signals as the positive and negative power voltage signals of the buffer amplifier 107. In addition, the positive and negative power voltage signals are arranged at two adjacent sides of the digital input voltage (Ud) to decrease the voltage difference loaded on the positive and negative power voltage of the buffer amplifier 107, so as to reduce the power consumption of the buffer amplifier 107. For simplicity, new examples are omitted hereinafter.

The DAC converter 106, the digital signals module 101, and the buffer amplifier 107 are electrically connected. The DAC converter 106 is configured to receive the digital input signals from the digital signals module 101, to apply the digital to analog conversion to the digital input signals to obtain the simulation input signals, and to transmit the simulation input signals to the buffer amplifier 107.

The buffer amplifier 107, the DAC converter 106, and the selector 105 are electrically connected. The buffer amplifier 107 is configured to receive the positive power voltage signals and the negative power voltage signals from the selector, and the simulation input signals from the DAC converter 106, and to conduct corresponding signals processing. In view of the above, the voltage difference between the positive and negative power voltage of the buffer amplifier 107 is smaller than that of the buffer amplifier 107 driven by the half-voltage driving method, and thus the power consumption of the buffer amplifier 107 may be reduced.

In view of the above, the comparator compares the digital input signals and one set of Gamma reference voltage signals to ensure the digital input signals are within the specific value range of one set of the Gamma reference voltage signals, and then generates the control signals indicative of the specific value range. The selector selects two signals from one set of the Gamma reference voltage signals, the first power voltage signals and the second power voltage signals to respectively be the positive power voltage signals and the negative power voltage signals. One of the positive power voltage signals and the negative power voltage signals obtains one of the second power voltage signals and the first power voltage signals such that the voltage difference between the positive and negative power voltage of the buffer amplifier is smaller than that of the buffer amplifier driven by the half-voltage driving method, and thus the power consumption of the buffer amplifier may be reduced. In such configuration, the temperature of the buffer amplifier and the source drive IC may be controlled so as to enhance the reliability of the liquid crystal panel.

In the second embodiment, under the condition "Vb−Va<Ub−Ua" in the first embodiment, the difference between the second embodiment and the first embodiment resides in that: the voltage interval "Vb−Va" may overlap with the voltage interval "Ub−Ua", and Ud is in the overlapped portion of the two voltage intervals.

Figure 9:
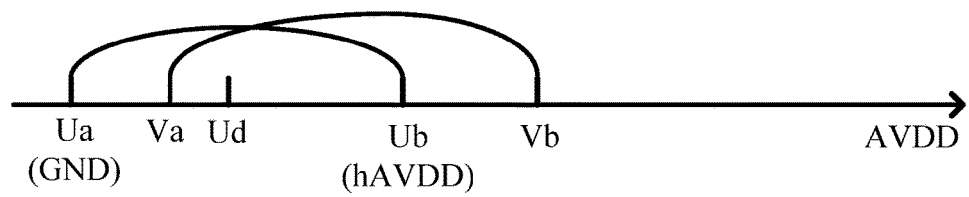
FIG. 9 is another schematic view showing the locations of the positive power voltage of the positive power voltage signals and of the negative power voltage of the negative power voltage signals selected by the selector of FIG. 2.

Specifically, in the second embodiment, as shown in FIG. 9, the half-voltage driving method is adopted ad the buffer amplifier 107 provides the output voltage of negative polarity. As stated above, Ua=GND and Ub=hAVDD. In the embodiment, Ua<Va<Ub<Vb. At this moment, Vb and Va are respectively two Gamma reference voltages within the {G1, G2, . . . Gi, . . . , Gn}. Under the circumstance, the selector 105 selects two Gamma reference voltage signals from the one set of Gamma reference voltage signals to respectively be the positive power voltage signals and the negative power voltage signals so as to ensure the voltage difference between the positive and negative power voltage, i.e., Vb−Va, is smaller than the voltage difference, i.e., hAVDD−GND, between the positive and negative power voltage, which reduces the power consumption of the buffer amplifier 107.

Figure 10:
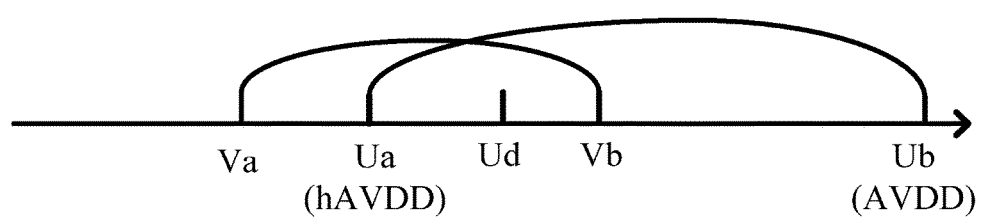
FIG. 10 is another schematic view showing the locations of the positive power voltage of the positive power voltage signals and of the negative power voltage of the negative power voltage signals selected by the selector of FIG. 2.

In the second embodiment, as shown in FIG. 10, when being driven by the half-voltage driving method, the buffer amplifier 107 provides the output voltage of positive polarity. As stated above, Ua=hAVDD and Ub=AVDD. In the embodiment, Va<Ua<Vb<Ub. At this moment, Vb and Va are respectively two Gamma reference voltages within the {G1, G2, . . . Gi, . . . , Gn}. Similarly, the selector 105 selects two Gamma reference voltage signals to be the positive and negative power voltage signals. In addition, the voltage difference, i.e., Vb−Va, of the positive and negative power voltage is smaller than the voltage difference, i.e., AVDD−hAVDD, when being driven by the half-voltage driving method, such that the power consumption of the buffer amplifier 107 is reduced.

Thus, in the second embodiment, the comparator compares the digital input signals and one set of Gamma reference voltage signals to ensure the digital input signals are within the specific value range of one set of the Gamma reference voltage signals, and then generates the control signals indicative of the specific value range.

The selector selects two signals from one set of the Gamma reference voltage signals, the first power voltage signals and the second power voltage signals to respectively be the positive power voltage signals and the negative power voltage signals such that the voltage difference between the positive and negative power voltage of the buffer amplifier is smaller than the voltage difference between the positive and negative power voltage when the half-voltage driving method is adopted. As such, the power consumption of the buffer amplifier is reduced. In such configuration, the temperature of the buffer amplifier and the source drive IC may be controlled so as to enhance the reliability of the liquid crystal panel.

The source drive IC of the liquid crystal panel in the present disclosure is described with reference to the drawings, i.e., FIGS. 1-10. The driving method of the liquid crystal panel will be described with reference to FIG. 11.

Figure 11:
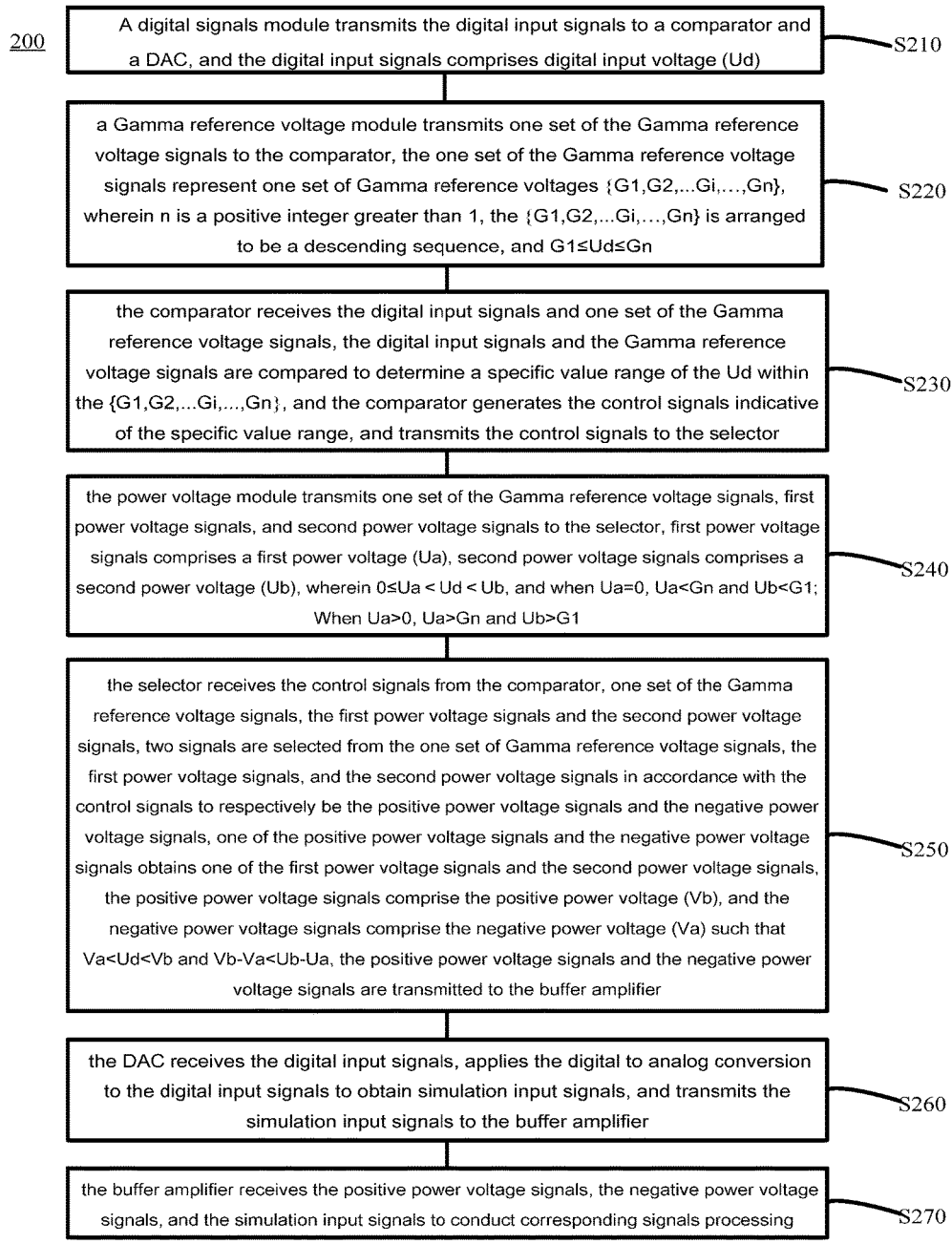
FIG. 11 is a flowchart illustrating the driving method in accordance with one embodiment.

As shown in FIG. 11, the driving method 200 of the liquid crystal panel includes:

In step S210, the digital signals module transmits the digital input signals to the comparator and the DAC, and the digital input signals include the digital input voltage (Ud).

In step S220, the Gamma reference voltage module transmits one set of the Gamma reference voltage signals to the comparator. The one set of the Gamma reference voltage signals represent one set of Gamma reference voltages {G1, G2, . . . Gi, . . . , Gn}, wherein n is a positive integer greater than 1. The {G1, G2, . . . Gi, . . . , Gn} is arranged from G1 to Gn in sequence, and G1≤Ud≤Gn.

In step S230, the comparator is configured to receive the digital input signals and one set of Gamma reference voltage signals. The digital input signals and the Gamma reference voltage signals are compared to determine a specific value range of the Ud within the {G1, G2, . . . Gi, . . . , Gn}, and to generate the control signals indicative of the specific value range, and to transmit the control signals to the selector 105.

In step S240, the power voltage module transmits one set of the Gamma reference voltage signals, first power voltage signals, and second power voltage signals to the selector 105. The first power voltage signals include the first power voltage (Ua), the second power voltage signals include the second power voltage (Ub), wherein 0≤Ua<Ud<Ub, and when Ua=0, Ua<Gn and Ub<G1; When Ua>0, Ua>Gn and Ub>G1.

In step S250, the selector 105 receives the control signals from the comparator 102, one set of the Gamma reference voltage signals, the first power voltage signals, and the second power voltage signals. Two signals are selected from the one set of Gamma reference voltage signals, the first power voltage signals, and the second power voltage signals in accordance with the control signals to respectively be the positive power voltage signals and the negative power voltage signals. One of the positive power voltage signals and the negative power voltage signals may obtain one of the first power voltage signals and the second power voltage signals. The positive power voltage signals include the positive power voltage (Vb), and the negative power voltage signals include the negative power voltage (Va) such that Va<Ud<Vb and Vb−Va<Ub−Ua. The positive power voltage signals and the negative power voltage signals are transmitted to the buffer amplifier.

In step S260, the DAC receives the digital input signals, applies the digital to analog conversion to the digital input signals to obtain simulation input signals, and transmits the simulation input signals to the buffer amplifier.

In step S270, the buffer amplifier receives the positive power voltage signals, the negative power voltage signals, and the simulation input signals to conduct corresponding signals processing.

Specifically, the digital signal module transmits the digital input signals to the comparator, and the Gamma reference voltage module transmits one set of the Gamma reference voltage signals to the comparator. After receiving the above two signals, the calculations are conducted to ensure Ud is within the specific value range of the {G1, G2, . . . Gi, . . . , Gn}. The specific value range relates to a specific value location of the Ud within the {G1, G2, . . . Gi, . . . , Gn}. That is, the digital input voltage (Ud) is between two adjacent Gamma reference voltages within the {G1, G2, . . . Gi, . . . , Gn}. Alternatively, the digital input voltage (Ud) may equal to one Gamma reference voltage within the {G1, G2, . . . Gi, . . . , Gn}. After the specific value range is determined by the comparator, the control signals indicative of the specific value range are generated, and the control signals are transmitted to the selector. The power voltage module provides one set of the Gamma reference voltage signals, first power voltage signals, and second power voltage signals to the selector. The first power voltage signals is the negative power voltage signals when the half-voltage driving method is adopted, the first power voltage signals include the first power voltage (Ua), wherein Ua may be GND, i.e., 0, or hAVDD. The second power voltage signals is the positive power voltage signals when the half-voltage driving method is adopted, and the second power voltage signals include the second power voltage (Ub). The Ub may be hAVDD or AVDD, wherein Ud, {G1, G2, . . . Gi, . . . , Gn}, Ua and Ub satisfy the equation: 0≤Ua<Ud<Ub, and when Ua=0, Ua<Gn and Ub<G1; When Ua>0, Ua>Gn and Ub>G1.

The selector is configured for receiving the control signals, one set of the Gamma reference voltage signals, the first power voltage signals, and the second power voltage signals. Two signals are selected from the one set of Gamma reference voltage signals, the first power voltage signals, and the second power voltage signals in accordance with the control signals to respectively be the positive power voltage signals and the negative power voltage signals. The positive power voltage (Vb) and the negative power voltage (Va) of the buffer amplifier satisfy the equation: Va<Ud<Vb and Vb−Va<Ub−Ua. One of the positive power voltage signals and the negative power voltage signals may obtain one of the first power voltage signals and the second power voltage signals. The digital signal module transmits the digital input signals to the DAC. the DAC receives the digital input signals, applies the digital to analog conversion to the digital input signals to obtain simulation input signals, and transmits the simulation input signals to the buffer amplifier. The positive and the negative power voltage ends of the buffer amplifier are loaded with the positive power voltage signals and the negative power voltage signals, the signal input end of the buffer amplifier receives the simulation input signals, and the buffer amplifier applies corresponding signals processing toward the input signals.

With respect to the driving method 200, the comparator compares the digital input signals and one set of Gamma reference voltage signals to ensure the digital input signals are within the specific value range of one set of the Gamma reference voltage signals, and then generates the control signals indicative of the specific value range. The selector selects two signals from one set of the Gamma reference voltage signals, the first power voltage signals and the second power voltage signals to respectively be the positive power voltage signals and the negative power voltage signals. The positive power voltage signals and the negative power voltage signals obtains the second power voltage signals and the first power voltage signals in different time such that the voltage difference between the positive and negative power voltage of the buffer amplifier is smaller than that of the buffer amplifier 107 driven by the half-voltage driving method, and thus the power consumption of the buffer amplifier may be reduced. In such configuration, the temperature of the buffer amplifier and the source drive IC may be controlled so as to enhance the reliability of the liquid crystal panel.

In the embodiment, in step S250, the Vb and the Va further satisfy the equation: Vb≤Ub and Va≤Ua, and wherein one of the Vb and the Va may obtain one of the Ub and the Ua.

Further, in step S230, the specific value range indicated by the control signals is Ud=Gi. Corresponding, the selector selects (i−1)-th Gamma reference voltage signals and the (i+1)-th Gamma reference voltage signals from the one set of Gamma reference voltage signals {G1, G2, . . . Gi, . . . , Gn} in accordance with the control signals, and the selected signals are configured to be the positive power voltage signals and the negative power voltage signals of the buffer amplifier, wherein Vb=Gi−1 and Va=Gi+1, and i=2, 3, 4, . . . , n−1.

Alternatively, in step S230, the specific value range is determined to be Ud∈(Gi,Gi+1). Corresponding, in step S250, the selector selects i-th Gamma reference voltage signals and the (i+1)-th Gamma reference voltage signals from the {G1, G2, . . . Gi, . . . , Gn} in accordance with the control signals, and the selected signals are configured to be the positive power voltage signals and the negative power voltage signals of the buffer amplifier, wherein Vb=Gi, Va=Gi+1, and i=1, 2, 3, . . . , n−1.

Alternatively, in step S230, the specific value range indicated by the control signals is Ud=Gi. The selector selects the second power voltage signals to be the positive power voltage signals in accordance with the control signals. In addition, the selector 105 selects a second Gamma reference voltage signals from one set of the Gamma reference voltage signals to be the positive power voltage signals of the buffer amplifier. The selector selects the second power voltage signals to be the negative power voltage signals in accordance with the control signals, wherein Vb=Ub=AVDD and Va=G2.

Alternatively, in step S230, the specific value range indicated by the control signals is Ud=Gn. Corresponding, in step S250, the selector selects a (n−1)-th Gamma reference voltage signals from one set of the Gamma reference voltage signals to be the positive power voltage signals of the buffer amplifier, and the selector selects the first power voltage signals to be the negative power voltage signals of the buffer amplifier in accordance with the control signals, wherein Vb=Gn−1, Va=Ua=GND.

Alternatively, in the embodiment, in step S250, under the condition "Vb−Va<Ub−Ua", the voltage interval "Vb−Va" may overlap with the voltage interval "Ub−Ua", and Ud is in the overlapped portion of the two voltage intervals.

Specifically, Ua=GND, Ub=hAVDD, Ua<Va<Ub<Vb. At this moment, Vb and Va are respectively two Gamma reference voltages within the {G1, G2, . . . Gi, . . . , Gn}. Under the circumstance, the selector selects two Gamma reference voltage signals from the one set of Gamma reference voltage signals to respectively be the positive power voltage signals and the negative power voltage signals so as to ensure the voltage difference between the positive and negative power voltage, i.e., Vb−Va, is smaller than the voltage difference, i.e., hAVDD−GND, between the positive and negative power voltage, which reduces the power consumption of the buffer amplifier.

Alternatively, Ua=hAVDD and Ub=AVDD, and Va<Ua<Vb<Ub. At this moment, Vb and Va are respectively two Gamma reference voltages within the {G1, G2, . . . Gi, . . . , Gn}. Similarly, the selector selects two Gamma reference voltage signals of one set of the Gamma reference voltage signals to be the positive and negative power voltage signals. In addition, the voltage difference, i.e., Vb−Va, of the positive and negative power voltage is smaller than the voltage difference, i.e., AVDD−hAVDD, when being driven by the half-voltage driving method, such that the power consumption of the buffer amplifier 107 is reduced.

It can be understood that the steps of the driving method 200 may correspond to the modules of the source drive IC 100, and the steps may be realized by the operations/functions by each of the modules of the source drive IC 100.

Above are embodiments of the present invention, which does not limit the scope of the present invention. Any modifications, equivalent replacements or improvements within the spirit and principles of the embodiment described above should be covered by the protected scope of the invention.

What is claimed is:

1. A source drive IC of liquid crystal panels, comprising:
   a digital signals module, a Gamma reference voltage module, a comparator, a power voltage module, a selector, a digital-to-analog converter (DAC) and a buffer amplifier;
   the digital signals module is configured for providing digital input signals, and for transmitting the digital input signals to the comparator and the DAC, and the digital input signals comprises a digital input voltage (Ud);
   the Gamma reference voltage module is configured for providing one set of Gamma reference voltage signals, and for transmitting the one set of Gamma reference voltage signals to the comparator, the one set of Gamma reference voltage signals comprise one set of Gamma reference voltage signals {G1, G2, . . . Gi, . . . , Gn}, wherein n is a positive integer greater than 1, the {G1, G2, . . . Gi, . . . , Gn} is arranged to be a descending sequence, and G1≤Ud≤Gn;
   the comparator is configured for receiving the digital input signals from the digital signals module and for receiving one set of Gamma reference voltage signals from the Gamma reference voltage module, comparing the digital input signals and the Gamma reference voltage signals to obtain a specific value range of the Ud within the {G1, G2, . . . Gi, . . . , Gn}, generating the control signals indicative of the specific value range, and transmit the control signals to the selector;
   the power voltage module is configured for providing one set of the Gamma reference voltage signals, first power voltage signals, and second power voltage signals to the selector, the first power voltage signals comprises a first power voltage (Ua), the second power voltage signals comprises a second power voltage (Ub), wherein 0≤Ua<Ud<Ub, and when Ua=0, Ua<Gn and Ub<G1, and when Ua>0, Ua>Gn and Ub>G1;
   the selector is configured for receiving the control signals from the comparator, one set of the Gamma reference voltage signals from the power voltage module, the first power voltage signals and the second power voltage signals, two signals are selected from the one set of Gamma reference voltage signals, the first power voltage signals, and the second power voltage signals in accordance with the control signals to respectively be the positive power voltage signals and the negative power voltage signals, one of the positive power voltage signals and the negative power voltage signals obtains one of the first power voltage signals and the second power voltage signals, the positive power voltage signals comprise the positive power voltage (Vb), and the negative power voltage signals comprise the negative power voltage (Va) such that Va<Ud<Vb and Vb−Va<Ub−Ua, the positive power voltage signals and the negative power voltage signals are transmitted to the buffer amplifier;
   the DAC is configured for receiving the digital input signals from the digital signals module, applying a digital to analog conversion to the digital input signals to obtain simulation input signals, and transmitting the simulation input signals to the buffer amplifier; and
   the buffer amplifier is configured for receiving the positive power voltage signals and the negative power voltage signals from the selector, and the simulation input signals from the DAC, and to conduct corresponding signals processing;
   wherein the Vb and the Va further satisfy the equation: Vb≤Ub and Va≤Ua, and wherein one of the Vb and the Va obtains one of the Ub and Ua.

2. The source drive IC as claimed in claim 1, wherein the comparator determines the specific value range to be Ud=Gi, the comparator generates the control signals indicative of the specific value range, and transmits the control signals to the selector;
   the selector selects (i−1)-th Gamma reference voltage signals and the (i+1)-th Gamma reference voltage signals from the one set of Gamma reference voltage signals provided by the power voltage module in accordance with the control signals from the comparator to respectively be the positive power voltage signals and the negative power voltage signals of the buffer amplifier, wherein Vb=Gi−1 and Va=Gi+1, and i=2, 3, 4, . . . , n−1.

3. The source drive IC as claimed in claim 1, wherein:
   the specific value range determined by the comparator is Ud (Gi,Gi+1), the comparator generates the control signals indicating the specific value range to be Ud (Gi,Gi+1) and transmitting the control signals to the selector;
   the selector selects i-th Gamma reference voltage signals and the (i+1)-th Gamma reference voltage signals from the one set of Gamma reference voltage signals in accordance with the control signals from the comparator to respectively be the positive power voltage signals and the negative power voltage signals of the buffer amplifier, wherein Vb=Gi, Va=Gi+1, and i=1, 2, 3, ..., n−1.

4. The source drive IC as claimed in claim 1, wherein:
the specific value range determined by the comparator is Ud=G1;
the selector selects the second power voltage signals according to the control signals to be positive power voltage signal of the buffer amplifier, and the selector selects second Gamma reference voltage signals from one set of the Gamma reference voltage signals to be the negative power voltage signals of the buffer amplifier, wherein Vb=Ub, and Va=G2.

5. The source drive IC as claimed in claim 1, wherein:
the specific value range determined by the comparator is Ud=Gn;
the selector selects the (n−1)-th Gamma reference voltage signals from one set of the Gamma reference voltage signals according to the control signals to be the positive power voltage signals of the buffer amplifier, and selects the first power voltage signals according to the control signals to be the negative power voltage signals of the buffer amplifier, wherein Vb=Gn−1, and Va=Ua.

6. The source drive IC as claimed in claim 1, wherein the one set of the Gamma reference voltage signals provided by the Gamma reference voltage module comprises 14 Gamma reference voltage signals.

7. A driving method of liquid crystal panels, comprising:
a digital signals module transmits the digital input signals to a comparator and a DAC, and the digital input signals comprises digital input voltage (Ud);
a Gamma reference voltage module transmits one set of the Gamma reference voltage signals to the comparator, the one set of the Gamma reference voltage signals represent one set of Gamma reference voltages {G1, G2, ... Gi, ..., Gn}, wherein n is a positive integer greater than 1, the {G1, G2, ... Gi, ..., Gn} is arranged to be a descending sequence, and G1≤Ud≤Gn;
the comparator receives the digital input signals and one set of the Gamma reference voltage signals, the digital input signals and the Gamma reference voltage signals are compared to determine a specific value range of the Ud within the {G1, G2, ... Gi, ..., Gn}, and the comparator generates the control signals indicative of the specific value range, and transmits the control signals to the selector;
the power voltage module transmits one set of the Gamma reference voltage signals, first power voltage signals, and second power voltage signals to the selector, first power voltage signals comprises a first power voltage (Ua), second power voltage signals comprises a second power voltage (Ub), wherein 0≤Ua<Ud<Ub, and when Ua=0, Ua<Gn and Ub<G1; When Ua>0, Ua>Gn and Ub>G1;
the selector receives the control signals from the comparator, one set of the Gamma reference voltage signals, the first power voltage signals and the second power voltage signals, two signals are selected from the one set of Gamma reference voltage signals, the first power voltage signals, and the second power voltage signals in accordance with the control signals to respectively be the positive power voltage signals and the negative power voltage signals, one of the positive power voltage signals and the negative power voltage signals obtains one of the first power voltage signals and the second power voltage signals;
the positive power voltage signals comprise the positive power voltage (Vb), and the negative power voltage signals comprise the negative power voltage (Va) such that Va<Ud<Vb and Vb−Va<Ub−Ua, the positive power voltage signals and the negative power voltage signals are transmitted to the buffer amplifier;
the DAC receives the digital input signals, applies the digital to analog conversion to the digital input signals to obtain simulation input signals, and transmits the simulation input signals to the buffer amplifier;
the buffer amplifier receives the positive power voltage signals, the negative power voltage signals, and the simulation input signals to conduct corresponding signals processing;
wherein the Vb and the Va further satisfy the equation: Vb≤Ub and Va≤Ua, and wherein one of the Vb and the Va obtains one of the Ub and the Ua.

8. The driving method as claimed in claim 7, wherein the comparator determines the specific value range to be Ud=Gi, the comparator generates the control signals indicative of the specific value range, and transmits the control signals to the selector;
the selector selects (i−1)-th Gamma reference voltage signals and the (i+1)-th Gamma reference voltage signals from the one set of Gamma reference voltage signals provided by the power voltage module in accordance with the control signals from the comparator to respectively be the positive power voltage signals and the negative power voltage signals of the buffer amplifier, wherein Vb=Gi−1 and Va=Gi+1, and i=2, 3, 4, ..., n−1.

9. The driving method as claimed in claim 7, wherein:
the specific value range determined by the comparator is Ud (Gi,Gi+1), the selector selects i-th Gamma reference voltage signals and the (i+1)-th Gamma reference voltage signals from the one set of Gamma reference voltage signals in accordance with the control signals to respectively be the positive power voltage signals and the negative power voltage signals of the buffer amplifier, wherein Vb=Gi, Va=Gi+1, and i=1, 2, 3, ..., n−1.

10. The driving method as claimed in claim 7, wherein:
the specific value range determined by the comparator is Ud=G1;
the selector selects the second power voltage signals according to the control signals to be positive power voltage signal of the buffer amplifier, and the selector selects second Gamma reference voltage signals from one set of the Gamma reference voltage signals to be the negative power voltage signals of the buffer amplifier, wherein Vb=Ub, and Va=G2.

11. The driving method as claimed in claim 7, wherein:
the specific value range determined by the comparator is Ud=Gn;
the selector selects the (n−1)-th Gamma reference voltage signals from one set of the Gamma reference voltage signals according to the control signals to be the positive power voltage signals of the buffer amplifier, and selects the first power voltage signals according to the control signals to be the negative power voltage signals of the buffer amplifier, wherein Vb=Gn−1, and Va=Ua.

12. The driving method as claimed in claim 7, wherein the one set of the Gamma reference voltage signals comprises 14 Gamma reference voltage signals.

* * * * *